United States Patent [19]

Froning et al.

[11] Patent Number: 5,091,045
[45] Date of Patent: Feb. 25, 1992

[54] METHOD OF COUPLING ELECTRO-OPTICAL COMPONENTS TO INTEGRATED-OPTICAL WAVEGUIDES

[76] Inventors: Edilbert A. Froning, Bodanstrasse 23, 7772 Oberuhldingen; Klaus A. Langner, Alte Dorfstrasse 61, 7770 Überlingen, both of Fed. Rep. of Germany

[21] Appl. No.: 575,977

[22] Filed: Aug. 31, 1990

[30] Foreign Application Priority Data

Aug. 31, 1989 [DE] Fed. Rep. of Germany ....... 3928894
Jan. 29, 1990 [DE] Fed. Rep. of Germany ....... 4002490

[51] Int. Cl.⁵ .................... B44C 1/22; C03C 15/00; C03C 25/06
[52] U.S. Cl. .................... 156/633; 156/257; 156/293; 156/657; 156/663
[58] Field of Search .............. 156/629, 633, 655, 657, 156/659.1, 663, 252, 257, 293; 65/3.11; 357/19, 72; 350/96.1, 96.11, 96.3; 437/127, 129, 207, 211, 213

[56] References Cited

U.S. PATENT DOCUMENTS

| | | | |
|---|---|---|---|
| 4,326,771 | 4/1982 | Henry et al. | 437/211 X |
| 4,411,057 | 10/1983 | Duda et al. | 437/129 X |
| 4,767,430 | 8/1988 | Deneka et al. | 156/663 X |
| 4,979,970 | 12/1990 | Dannoux et al. | 65/31 X |
| 5,008,213 | 4/1991 | Kolesar | 437/211 X |

*Primary Examiner*—William A. Powell
*Attorney, Agent, or Firm*—Lee, Mann, Smith, McWilliams & Sweeney

[57] ABSTRACT

A method of coupling electro-optical components (20) to integrated-optical waveguides (12) which are provided in a substrate (10) comprises the steps of: (a) applying an etching agent to the substrate (10) such that a cavity (18) is etched into the surface of the substrate (10) and intersects the waveguide (12); (b) positioning and holding an electro-optical component (20) within the cavity (18) in the desired position relative to the waveguide (12); and (c) encasing the component (20) within the cavity (18) into a rigidifying cast material having a refractive index matched to the refractive index of the waveguide (12). Other embodiments provide for making the cavity by boring or milling.

20 Claims, 5 Drawing Sheets

METHOD OF COUPLING ELECTRO-OPTICAL COMPONENTS TO INTEGRATED-OPTICAL WAVEGUIDES

TECHNICAL FIELD

The invention relates to a method of coupling electro-optical components to integrated-optical waveguides which are provided in a substrate.

BACKGROUND ART

For making integrated optical waveguides, a substrate, conventionally of glass, is covered by a metal mask. The structure of the metal mask such that the paths of the waveguides to be formed are left exposed is obtained by photo-etching technique. Then the refractive index of the substrate in the areas not covered by the mask is increased by ion exchange. It is necessary to couple these waveguides optically with electro-optical components, i.e. with light sources or photoelectric detectors. It is known to establish this coupling by fiber optical waveguides. In practice, this method presents considerable problems.

German published patent application 3,731,311 relates to a combined sender and receiver component of a bidirectional optical transmission system having a waveguide structure on the surface of a silicon plate is coupled to a transmission fiber. A plate-shaped component with a transmitter diode is also located on the surface of the silicon plate and is coupled to the waveguide structure through a ball lens. A further plate-shaped component with a receiver diode is also arranged on the surface of the silicon plate and is coupled to a curved branch of the waveguide structure through a reflecting, inclined surface. German published patent application 3,543,558 relates to an opto-electric coupling arrangement in combination with a carrier element of a glass or ceramic plate. An electrical component is located on the surface of the carrier element and is connected to a photodetector through a bond wire. The photodetector is located on a contact ring, which is arranged on the surface of the carrier element. Through an aperture of the carrier element and a deflecting element, the photodetector is coupled to a waveguide in a v-shaped notch formed in the carrier element.

U.S. Pat. No. 4,756,702 relates to an optical component integrated into the interior of a glass body, the optical component being coupled to fibers at opposite ends of the glass body. The component buried in the glass body is formed within the glass body by a ion exchange method.

DISCLOSURE OF THE INVENTION

It is the object of the invention to attach electrooptical components, i.e. light sources or photoelectric detectors, to integrated-optical waveguides with simple means and easily mastered technology in such a way that they are optically coupled with the waveguides with low attenuation of the light.

According to the invention this object is achieved by the steps of:

(a) making a cavity, which intersects a waveguide, in the surface of said substrate, (b) positioning and holding said component in said cavity in a desired position relative to said waveguide, and (c) encasing said component within said cavity into a cast rigidifying material.

The invention can be realized in that an etching agent is applied to the surface of said substrate to form said cavity.

The etching agent can be applied under a simple magnifying lens. Etching is effected as a function of time and temperature and can be stopped by rinsing with water. The etching results in a rather clean eching edge. The electro-optical components are adjusted in the path of rays of the waveguide and are well fixed in their adjusted positions by the rigidifying material. At the same time, the rigidifying material ensures low-attenuation transition of the light between waveguide and electro-optical component, if the refractive index of the material is selected properly.

A layer not attacked by said etching agent may be applied to the surface of the substrate around the region of said cavity to be formed. The etching process can be carried out in such a way that an undercut is formed, whereby the cavity defines an overhanging wall portion below this layer. The waveguide ends in this overhanging wall portion.

The method of the invention can, however, also be carried out in that the cavity is formed by machining of the substrate.

The cavity may be formed by boring or milling.

The cavity having the shape of a segment of a cylinder and having two mutually parallel, plane side walls perpendicular to the surface of said substrate can be milled by means of a milling tool.

When the waveguides in the substrate are formed by covering the surface of the substrate with a metal layer having apertures therein along the desired paths of the waveguides, forming these waveguides in the substrate by ion exchange through the apertures, and removing the metal layer by etching, after the waveguides have been formed, portions of the metal layer adjacent the positions of the electro-optical components to be coupled to waveguides may be covered with a covering layer, prior to said removing-by-etching step, the covering layer may be removed, whereby said portions of the metal layer remain on the surface of the substrate to form bond contacts, and bond wires of said electro-optical may be connected with components with said bond contacts.

The rigidifying material may be synthetic resin. The rigidifying material may, however, also be silicon rubber. For some applications, it is advantageous, if the rigidifying material is a low refractive index, optical, uv-initiated adhesive.

If the electro-optical component is a laser chip having a heat sink, the laser chip when the heat sink may be cemented upside-down on the substrate such as to radiate into the waveguide. To assemble the laser and the integrated optical structure, the laser can be positioned by means of a micromanipulator, and the coupling-in intensity of the laser can be observed during the positioning procedure. The adjustment can then be effected depending on the observed coupling-in intensity such that optimum coupling-in intensity is achieved.

To avoid undesired reduction of the reflectivity of the end faces of the laser due to the refractive index of the material, it is advantageus if only the heat sink of said laser is cemented to said substrate, the laser being encapulated together with air.

In order to achieve high coupling efficiency, the laser should be spaced from the end face of the waveguide by less than 5μ.

For making an integrated optical component with a laser having an external resonance cavity, the laser, to reduce the reflection in the region of its front facet, may be immersed in a cast rigidifying material the index of refraction of which is substantially equal to the index of refraction of the waveguide. The laser should be metallized on its rear surface.

For making an integrated optical component with a laser having an external resonance cavity, the laser may, however, also be metallized on its rear surface, the waveguide extending to an external mirror. This external mirror may be a metallized, reflecting end face of the substrate, the waveguide extending to said end face.

The electro-optical component may comprise a photodiode. The electro-optical component may, however, also comprise a light emitting diode. The photodiode or the light emitting diode may be part of a chip.

Embodiments of the invention are described hereinbelow with reference to the accompanying drawings.

PREFERRED EMBODIMENT OF THE INVENTION

Figure 1:
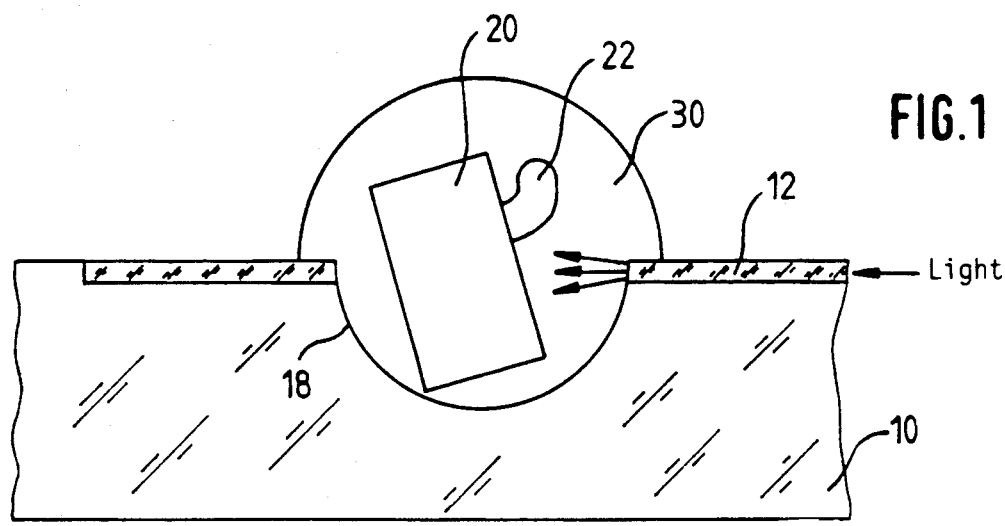
FIG. 1 is a schematic side elevation of an electro-optical component which is coupled to an integrated-optical waveguide.

Numeral 10 designates a glass substrate. A waveguide 12 is formed in this glass substrate by covering the glass substrate with a metal layer. This metal layer is treated by a photo-etching process such that the path of the waveguide 12 becomes exposed and the remaining surface of the substrate 10 remains covered. The refractive index of the glass in the area of the exposed surface portions is increased by ion exchange, whereby the waveguide 12 is formed. After this ion exchange, the metal layer is removed by etching. This is a well known procedure and, therefore, is not described in detail.

Prior to the removal of the metal layer by etching, however, surface portions 14 and 16 are covered by a covering layer. These surface portions 14 and 16 are located on both sides of the location, where an electro-optical component, i.e. either a light source or a photoelectric detector, is to be coupled to the waveguide 12. Therefore, the surface portions 14 and 16 are not removed during the removal-by-etching step but remain on the surface of the substrate. The metal layer in these surface portions 14 and 16 form bond contacts for the electro-optical component.

A drop of an etching agent is applied to the surface of the substrate 10 between these surface portions 14 and 16. If the substrate 10 is a glass substrate, the etching agent is hydrofluoric acid (HF). This etching agent etches a cavity 18 into the surface of the substrate 10. The depth of the cavity 18 can be determined by time and temperature of the etching process. After a desired depth of the cavity 18 has been reached, the etching process is interrupted. This can be effected by rinsing with water. The cavity intersects the waveguide 12. Now an electro-optical component 20 is inserted into this cavity 18. This can be a light emitting diode or a photodiode. The component 20 is bonded by means of its bond wires 22 and 24 to the bond contacts which are formed by the metal layer left in the surface portions 14 and 16. The connection of the electro-optical component is achieved conventionally by means of conductive adhesive 26 and 28.

The electro-optical component 20 is then aligned with the path of rays of the waveguide 12. After this alignment, the component 20 is encased into a drop of a cast rigidifying liquid. The refractive index of this rigidifying liquid is selected to ensure good optical coupling between the waveguide 12 and the electro-optical component 20. After the liquid has rigidified, the electro-optical component 20 is fixed in its position relative to the waveguide 12. It is protected from environmental influences and virtually buried in the substrate. The rigidified drop forms an elevation 30 above the component. This elevation 30 encases also the bond wires 22 and 24 and the connection thereof with the bond contacts.

Figure 2:
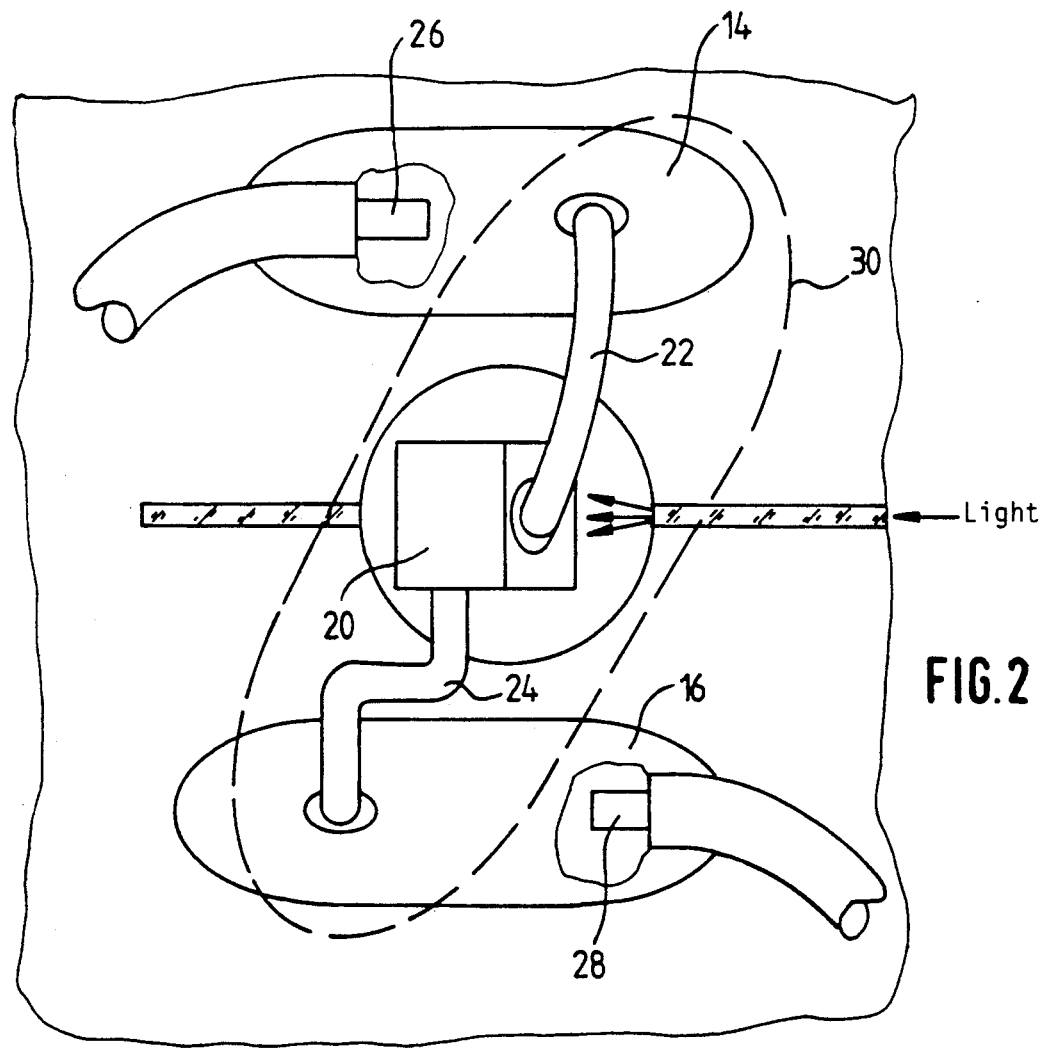
FIG. 2 is a fractional plan view of the substrate with the waveguide and the electro-optical component.

The material for encasing the electro-optical components may be a synthetic resin or a silicon rubber. In the embodiment of FIGS. 1 and 2, the electro-optical component 20 is a photoelectric detector, for example a photodiode. This photoelectric detector is mounted on a chip, which may, for example, contain the preamplifier. Instead of a photoelectric detector also a light emitting diode may be attached in the same way.

Figure 3:
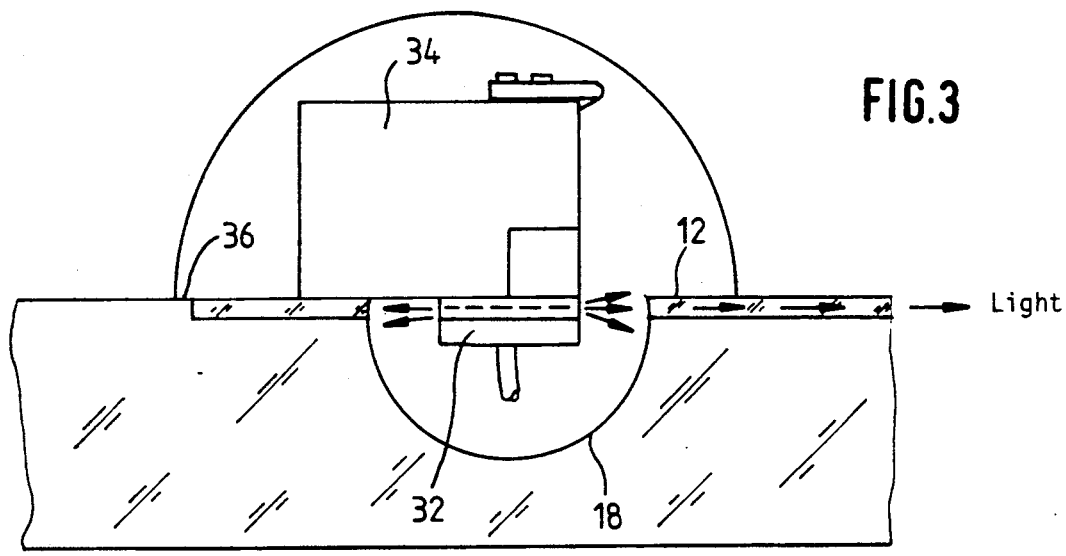
FIG. 3 is a schematic side elevation of an arrangement in which a laser provided with a heat sink is coupled to a waveguide.
Figure 4:
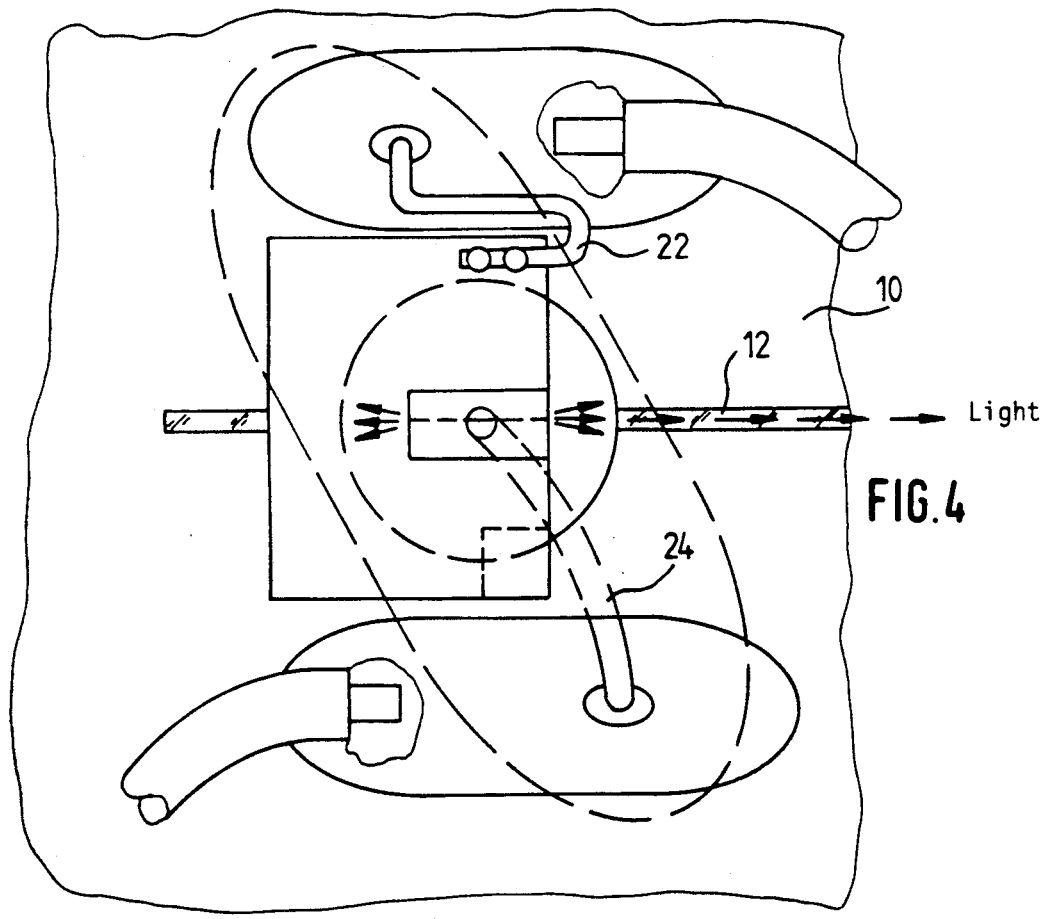
FIG. 4 is a fractional plan view of the arrangement of FIG. 3.

FIGS. 3 and 4 illustrate, how a laser 32 is attached by substantially the same procedure. Corresponding elements are designated by the same reference numerals as in FIGS. 1 and 2. The laser 32 has a heat sink 34. The laser 32 with the heat sink 34 is mounted upside-down in such a way, that the surface carrying the laser of the block-shaped heat sink 34 engages the surface 36 of the substrate 10. The laser 32 extends into the etched cavity 18. The laser 32 is adjusted relative to the waveguide 12. Then the heat sink 34 is cemented to the surface 36. Eventually, the whole arrangement including the bond wires 22 and 24 is again encased into a rigidifying liquid.

Figure 5:
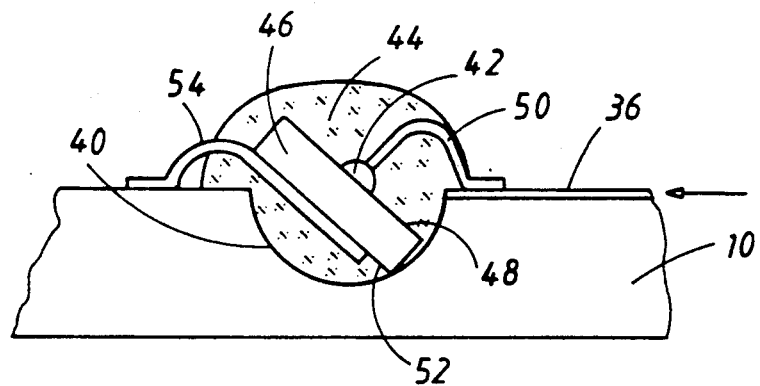
FIG. 5 shows a photodiode similar to FIG. 1, which is arranged in a cavity obtained by machining and which is optically coupled to a waveguide.

In the embodiment of FIG. 5, a cavity 40 is formed in the surface 36 of the substrate 10 by machining, namely by boring. Similar to FIG. 1, the cavity 40 intersects the waveguide 12. A photodiode 42 is inserted into the cavity 40. The photodiode 42 is substantially larger than the waveguide 12. Therefore, even with an angle of radiation of, for example, 20° at the end face of the waveguide 12, a good receiving efficiency of the photodiode 42 will result. By filling the cavity with a cast material 44 in the form of a low refractive index adhesive, the angle of radiation will be additionally reduced. The photodiode 42 is part of a chip 46. The chip 46 is inclined to the surface 36 of the substrate 10 and to the cavity 40. For the electrical connection, the front side 48 of the chip is bonded conventionally with a bond wire 50. A bond wire 54 is cemented to the rear side 52 of the chip by means of conductive silver. Lands of the substrate mask left during the removal-by-etching step serve as outer bond contacts as described above. For this purpose, also thin film electrodes could be applied subsequently.

Figure 6:
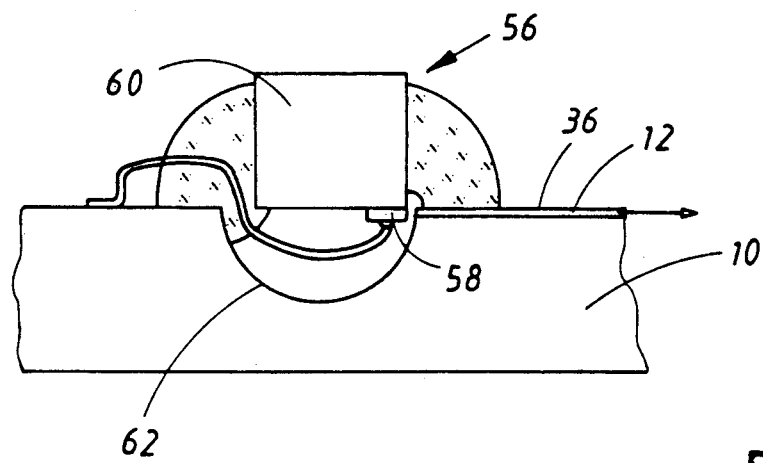
FIG. 6 shows a semiconductor laser with heat sink similar to FIG. 3, which is arranged in a cavity produced by boring and which is coupled to a waveguide.

In the embodiment of FIG. 6, a laser chip 56 with a laser 58 and a heat sink 60 is arranged "upside-down" in a cavity 62 in the surface of the substrate 10. The laser is adjusted relative to the end face of the waveguide 12 by means of a micromanipulator. During the adjustment, the coupling-in intensity of the laser 58 into the waveguide 12 is measured. The adjustment is effected such that the coupling-in intensity is optimized. As, when a laser is coupled to the waveguide, deficiencies of the surface have much serious effects than with the coupling of a photodiode, the distance between the laser 58 and the end face of the waveguide 12 have to be kept very small. With a cavity obtained by boring or etching of about 0.3 mm diameter, a distance of 5 μm can be achieved.

The laser has to be fixed in the position thus found. The laser chip must not be damaged. Also the step of the refractive index and thus the reflectivity at the end faces of the laser 58 should not be changed. For this reason, in the embodiment of FIG. 6, the laser 58 is cemented to the substrate 10 by means of the cast material with its heat sink 60 only. The laser 58 itself is encapsuled within the cavity 62 with air enclosed in the cavity. A low refractive index, optical, uv-initiated adhesive serves as cast material.

Figure 7:
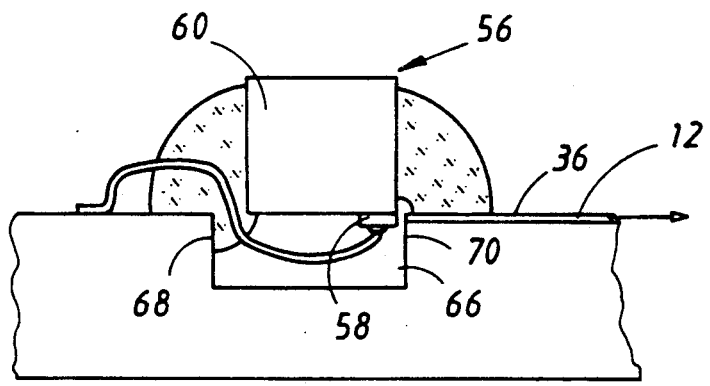
FIG. 7 shows a semiconductor laser similar to FIG. 6, which is arranged in a cavity produced by transverse milling.

The embodiment of FIG. 7 is similar to the embodiment of FIG. 6. Corresponding elements are designated by the same reference numerals as in FIG. 6.

Figure 8:
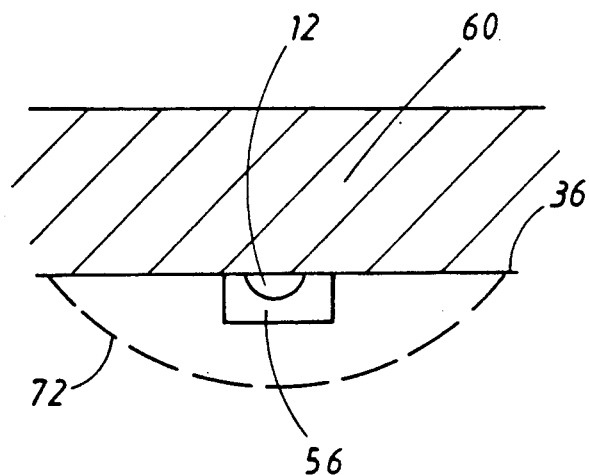
FIG. 8 is an elevational view of the waveguide, the laser, the cavity and the heat sink as viewed from the right in FIG. 7.
Figure 9:
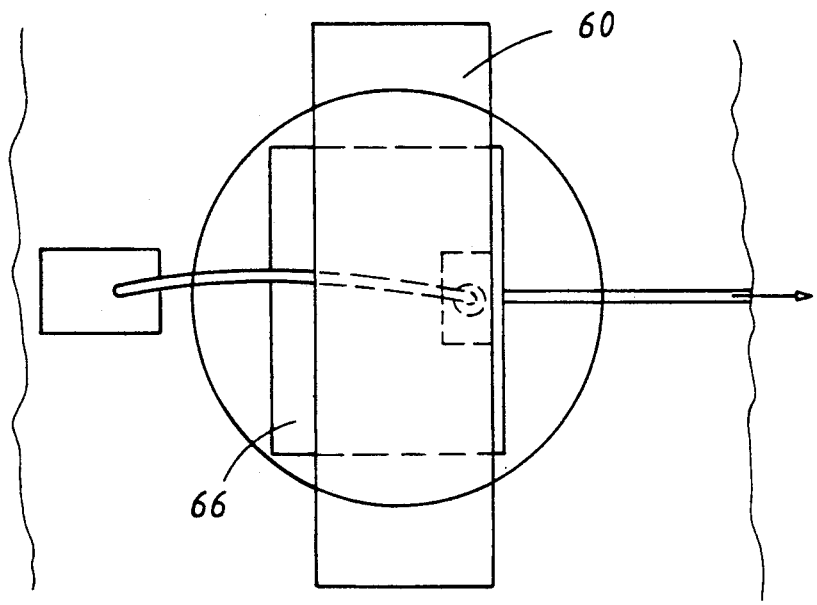
FIG. 9 is an associated plan view.

With the embodiment of FIG. 7, the cavity is formed by a transverse milled groove 66. As can be seen from FIGS. 8 and 9, the milled groove 66 has the shape of a cylinder section. The transverse milled groove 66 is milled by moving a small disc-shaped milling tool transversely to the axis of the waveguide 12. The transverse milled groove 66 has two mutually parallel plane end faces 68 and 70 perpendicular to the surface 36 of the substrate 10 and to the axis of the waveguide 12. A cylindrical bottom and wall surface 72 of the transverse milled groove 66 extends between the end faces 68 and 70, as can be seen from FIG. 8.

With such a transverse milled groove, it is possible to reduce the distance of the laser 58 from the waveguide 12 to about 2 μm.

Figure 10:
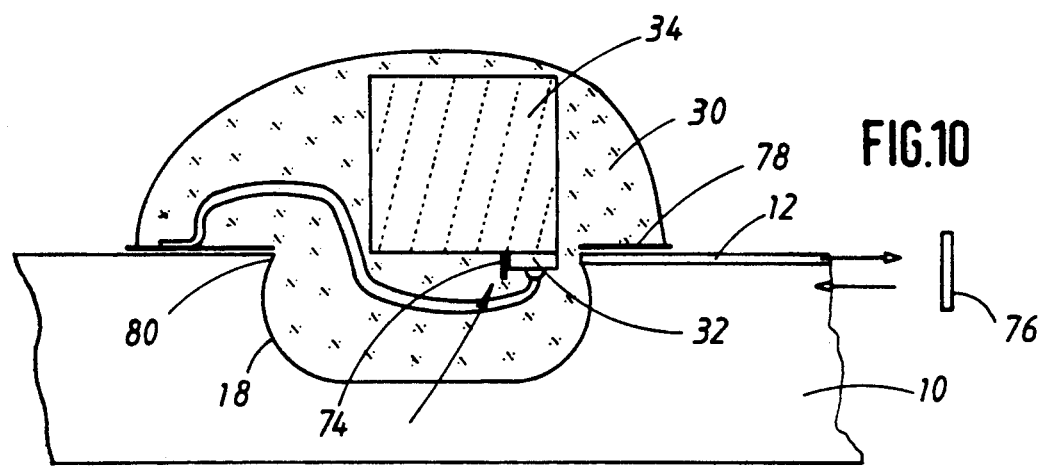
FIG. 10 shows an integrated optical component with a laser having an external resonance cavity.

For making a laser arrangement constructed as integrated optical component, wherein the laser operates with an external resonance cavity, the laser 32 is completely encased within the groove 18 into a rigidifying cast material, as illustrated in FIG. 10. Thereby the front facet of the laser is coupled with the waveguide through the cast material, which has a refractive index substantially matched to the refractive index of the waveguide. Then, however, it is necessary to metallize and make reflecting the rear surface 74 of the laser 32. Such an arrangement can be used to construct a rotation sensor as described in European patent application 0,290,723. The waveguide can extend to an external mirror 76 schematically shown in FIG. 10.

In the embodiment of FIG. 10, the cavity 18 is also formed by etching. To this end, the surface 36 of the substrate 10 is covered by a layer 78 of a material resistant against the etching agent. The layer 78 can, for example, consist of an etch-stopping lacquer. The the etching process is controlled such that an "undercut" is obtained. The etching agent removes the substrate material in the region below the layer 78. An overhang 80 at the upper upper rim of the wall of the cavity 18 closely below the layer 78 is formed. The waveguide extends into the region of this overhang 80. This facilitates placing the laser 32 closely in front of the end of the waveguide 12.

In similar way, of course, also the cavity for another electro-optical component can be formed and made.

Figure 11:
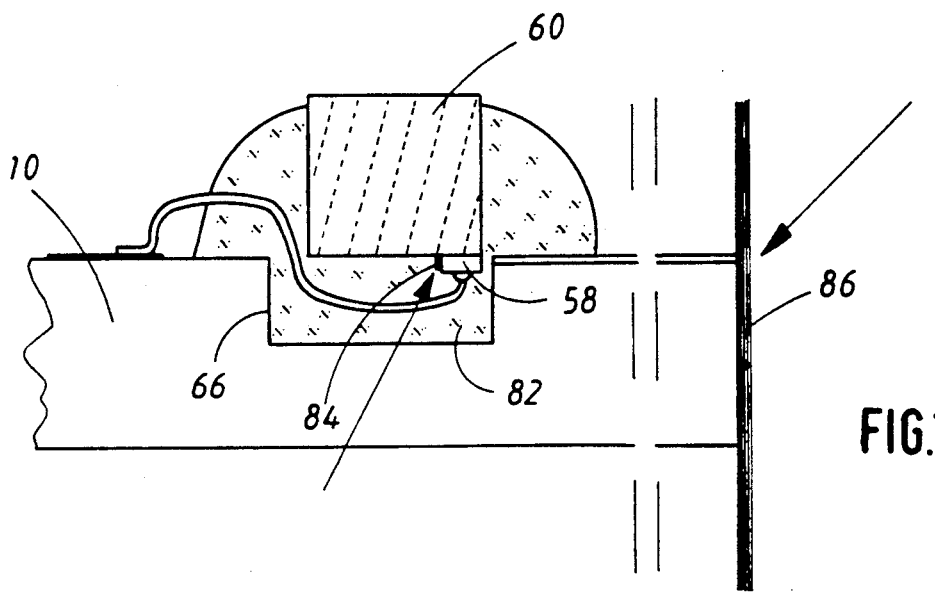
FIG. 11 shows another arrangement with a laser and an external resonance cavity.
Figure 12:
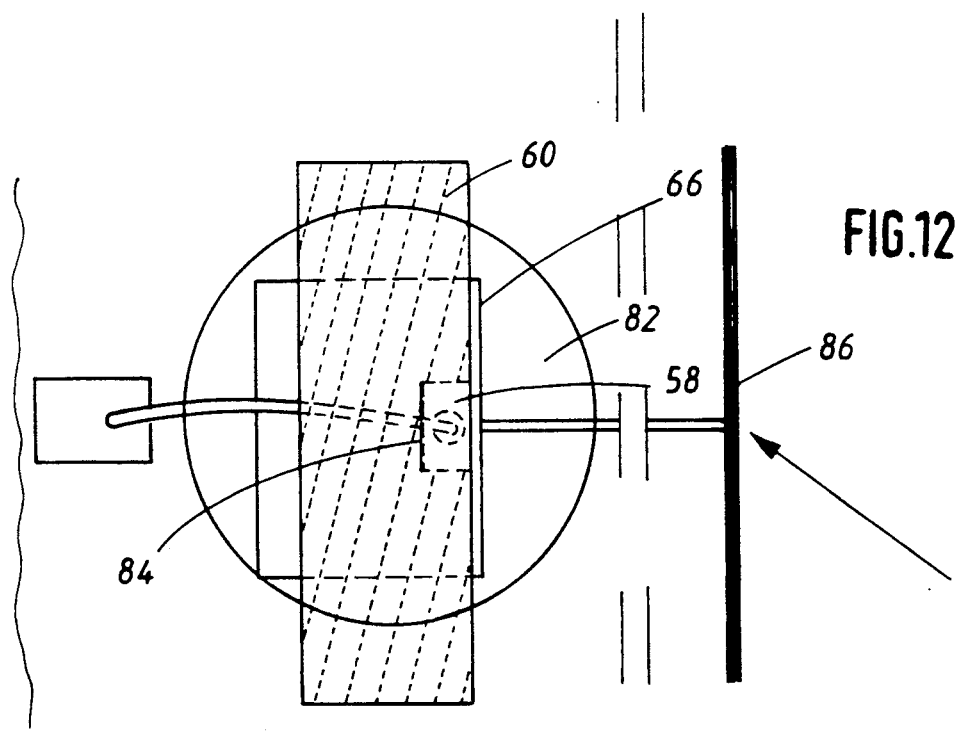
FIG. 12 is an associated plan view.

FIGS. 11 and 12 show also an arrangement with a laser 58 in an integrated optical component, the laser having an external resonance cavity.

The laser 58 is arranged, also "upside-down", in a cavity. The heat sink 60 is placed on the surface 36 of the substrate 10. The cavity is a transverse milled groove similar to that of FIGS. 7 to 9. In contrast to the arrangement of FIGS. 7 to 9, the laser of the arrangement of FIGS. 11 and 12 is encased within the cavity into a rigidifying liquid 82. The rear surface of the laser 58 remote from the waveguide 12 is provided with a reflecting metallization 84. Furthermore, the resonance cavity is limited by a reflecting metallization 86 which is applied to an end face of the substrate consisting of glass. The waveguide 12 extends to this metallized end face.

We claim:

1. A method of coupling an electro-optical component to an integrated-optical waveguide provided in a substrate, comprising the steps of:
    (a) making a cavity, which intersects the waveguide, in the surface of said substrate,
    (b) positioning and holding said component in said cavity in a desired position relative to said waveguide, and
    (c) encasing said component within said cavity into a cast rigidifying material.

2. A method as claimed in claim 1, wherein an etching agent is applied to the surface of said substrate to form said cavity.

3. A method as claimed in claim 2, wherein said substrate is glass and said etching agent is hydrofluoric acid.

4. A method as claimed in claim 2 wherein said forming of said cavity comprises the steps of
    (a) applying a layer not attacked by said etching agent to the surface of the substrate around the region of said cavity to be formed,
    (b) carrying out the etching process in such a way that an undercut is formed, whereby said cavity defines an overhanging wall portion below said layer,
    (c) said waveguide ending in this overhanging wall portion.

5. A method as claimed in claim 1, wherein said cavity is formed by machining of the substrate.

6. A method as claimed in claim 5, wherein said cavity is formed by boring.

7. A method as claimed in claim 5, wherein said cavity is formed by milling.

8. A method as claimed in claim 7, wherein said cavity having the shape of a segment of a cylinder and having two mutually parallel, plane side walls perpendicular to the surface of said substrate is milled by means of a milling tool.

9. A method as claimed in claim 1, wherein said rigidifying material is synthetic resin.

10. A method as claimed in claim 1, wherein said rigidifying material is silicon rubber.

11. A method as claimed in claim 1, wherein said rigidifying material is a low refractive index, optical, uv-initiated adhesive.

12. A method as claimed in claim 1, comprising the steps of
    (a) covering the surface of said substrate with a metal layer having apertures therein along the desired paths of said waveguide,
    (b) forming said waveguide in said substrate by ion exchange through said apertures, and
    (c) removing said metal layer by etching, after said waveguide has been formed,
and further comprising the steps of
    (d) covering portions of said metal layer adjacent the positions of said electro-optical component to be coupled to said waveguides with a covering layer, prior to said removing-by-etching step,
    (e) removing said covering layer, whereby said portions of said metal layer remain on the surface of said substrate to form bond contacts, and
    (f) connecting bond wires of said electro-optical component with said bond contacts.

13. A method as claimed in claim 1, wherein
    (a) said electro-optical component is a laser chip having a heat sink, and
    (b) said laser chip with the heat sink is cemented upside-down on the substrate such as to radiate into the waveguide.

14. A method as claimed in claim 13, wherein
    (a) said laser chip is positioned by means of a micromanipulator, and
    (b) the coupling-in intensity of the laser chip is observed during the positioning procedure.

15. A method as claimed in claim 13 wherein only the heat sink of said laser chip is cemented to said substrate, the laser chip being encapulated together with air.

16. A method as claimed in claim 11 for making an integrated optical component with a laser having an external resonance cavity, wherein said laser, in the region of its front facet, is immersed in a cast rigidifying material the index of refraction of which is substantially equal to the index of refraction of said waveguide.

17. A method as claimed in claim 15, wherein for making an integrated optical component with a laser having an external resonance cavity, wherein said laser is metallized on its rear surface, and said waveguide extends to an external mirror.

18. A method as claimed in claim 17, wherein said external mirror is a metallized, reflecting end face of said substrate, said waveguide extending to said end face.

19. A method as claimed in claim 1, wherein said electro-optical component comprises a photodiode.

20. A method as claimed in claim 1, wherein said electro-optical component comprises a light emitting diode.

* * * * *